(12) United States Patent
Sasaki et al.

(10) Patent No.: US 9,066,457 B2
(45) Date of Patent: Jun. 23, 2015

(54) SEMICONDUCTOR DEVICE, METHOD OF MANUFACTURING THE SAME, AND METHOD OF MANUFACTURING WIRING BOARD

(75) Inventors: Naoto Sasaki, Kanagawa (JP); Hiroshi Ozaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 3 days.

(21) Appl. No.: 13/416,405

(22) Filed: Mar. 9, 2012

(65) Prior Publication Data
US 2012/0241949 A1 Sep. 27, 2012

(30) Foreign Application Priority Data
Mar. 23, 2011 (JP) .................................. 2011-064837

(51) Int. Cl.
*H01L 23/29* (2006.01)
*H05K 3/34* (2006.01)
(Continued)

(52) U.S. Cl.
CPC ............ *H05K 3/3436* (2013.01); *H01L 21/563* (2013.01); *H01L 25/0657* (2013.01); *H01L 2225/06513* (2013.01); *H05K 3/3473* (2013.01); *H05K 2201/10674* (2013.01); *H05K 2201/10984* (2013.01); *H01L 2224/05027* (2013.01); *H01L 2224/10145* (2013.01); *H01L 2224/03472* (2013.01); *H01L 2224/03906* (2013.01); *H01L 21/4846* (2013.01); *H01L 24/03* (2013.01); *H01L 24/11* (2013.01); *H01L 24/13* (2013.01); *H01L 24/81* (2013.01); *H01L 24/83* (2013.01); *H01L 24/92* (2013.01); *H01L 2224/0345* (2013.01); *H01L 2224/03462* (2013.01); *H01L 2224/0391* (2013.01); *H01L 2224/05147* (2013.01); *H01L 2224/05166* (2013.01); *H01L 2224/05559* (2013.01); *H01L 2224/05644* (2013.01); *H01L 2224/05647* (2013.01); *H01L 2224/05655* (2013.01); *H01L 2224/10126* (2013.01); *H01L 2224/11462* (2013.01); *H01L 2224/1191* (2013.01); *H01L 2224/13007* (2013.01); *H01L 2224/13109* (2013.01); *H01L 2224/13111* (2013.01); *H01L 2224/13113* (2013.01); *H01L 2224/16014* (2013.01); *H01L 2224/81024* (2013.01); *H01L 2224/81193* (2013.01); *H01L 2224/8121* (2013.01); *H01L 2224/81815* (2013.01); *H01L 2224/83102* (2013.01); *H01L 2224/83191* (2013.01); *H01L 2224/92125* (2013.01); *H01L 2224/03912* (2013.01); *H01L 2224/11472* (2013.01);
(Continued)

(58) Field of Classification Search
CPC . H01L 24/10; H01L 24/12; H01L 2224/1401; H01L 2224/1601
USPC .......... 438/612; 257/779, 737, 750, 773, 780, 257/781
See application file for complete search history.

(56) References Cited

U.S. PATENT DOCUMENTS

| | | | | |
|---|---|---|---|---|
| 5,436,198 A | * | 7/1995 | Shibata ..................... | 438/613 |
| 6,232,563 B1 | * | 5/2001 | Kim et al. .................. | 174/261 |

(Continued)

FOREIGN PATENT DOCUMENTS

JP 09-097795 4/1997

*Primary Examiner* — David Zarneke
(74) *Attorney, Agent, or Firm* — Fishman Stewart Yamaguchi PLLC

(57) ABSTRACT

A semiconductor device includes: a solder bump including a barrier metal layer formed on an electrode pad portion of a substrate, and a solder layer formed at a central portion of an upper surface of the barrier metal layer so as to have a smaller outer diameter than that of the barrier metal layer.

20 Claims, 12 Drawing Sheets

(51) Int. Cl.
*H01L 25/065* (2006.01)
*H01L 21/48* (2006.01)
*H01L 23/00* (2006.01)
*H01L 21/56* (2006.01)

(52) U.S. Cl.
CPC ............... *H01L2224/03914* (2013.01); *H01L 2224/11906* (2013.01); *H01L 2224/05572* (2013.01); *H01L 2224/16145* (2013.01); *H01L 2224/73104* (2013.01); *H01L 2224/73204* (2013.01); *H01L 2924/00013* (2013.01); *H01L 2924/01029* (2013.01); *H01L 2224/05022* (2013.01); *H01L 2224/05124* (2013.01); *H01L 2224/13565* (2013.01); *H01L 2224/83192* (2013.01); *H01L 2924/00014* (2013.01)

(56) References Cited

U.S. PATENT DOCUMENTS

| | | | |
|---|---|---|---|
| 6,319,846 B1 * | 11/2001 | Lin et al. | 438/754 |
| 6,784,087 B2 * | 8/2004 | Lee et al. | 438/612 |
| 6,794,732 B2 * | 9/2004 | Nakatani | 257/643 |
| 6,956,292 B2 * | 10/2005 | Fan et al. | 257/780 |
| 7,452,803 B2 * | 11/2008 | Lin et al. | 438/624 |
| 7,550,375 B2 * | 6/2009 | Wang et al. | 438/613 |
| 7,709,961 B2 * | 5/2010 | Greenberg et al. | 257/769 |
| 7,846,830 B2 * | 12/2010 | Takewaki et al. | 438/614 |
| 7,858,521 B2 * | 12/2010 | Knollenberg et al. | 438/674 |
| 8,101,866 B2 * | 1/2012 | Hsu | 174/257 |
| 8,211,789 B2 * | 7/2012 | Huang | 438/613 |
| 8,338,286 B2 * | 12/2012 | Perfecto et al. | 438/613 |
| 8,441,124 B2 * | 5/2013 | Wu et al. | 257/737 |
| 8,461,679 B2 * | 6/2013 | Lee et al. | 257/737 |
| 2002/0048924 A1 * | 4/2002 | Lay et al. | 438/613 |
| 2004/0005771 A1 * | 1/2004 | Fan et al. | 438/613 |
| 2005/0266670 A1 * | 12/2005 | Lin et al. | 438/613 |
| 2007/0231951 A1 * | 10/2007 | Suryakumar | 438/106 |
| 2007/0231957 A1 * | 10/2007 | Mitsuhashi | 438/106 |
| 2009/0149016 A1 * | 6/2009 | Park et al. | 438/614 |
| 2011/0049705 A1 * | 3/2011 | Liu et al. | 257/737 |
| 2013/0140696 A1 * | 6/2013 | Aoi | 257/737 |
| 2014/0217579 A1 * | 8/2014 | Ganesan et al. | 257/737 |

* cited by examiner

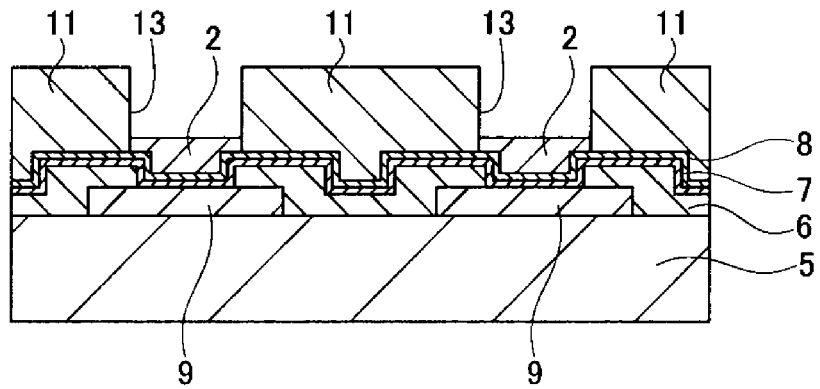
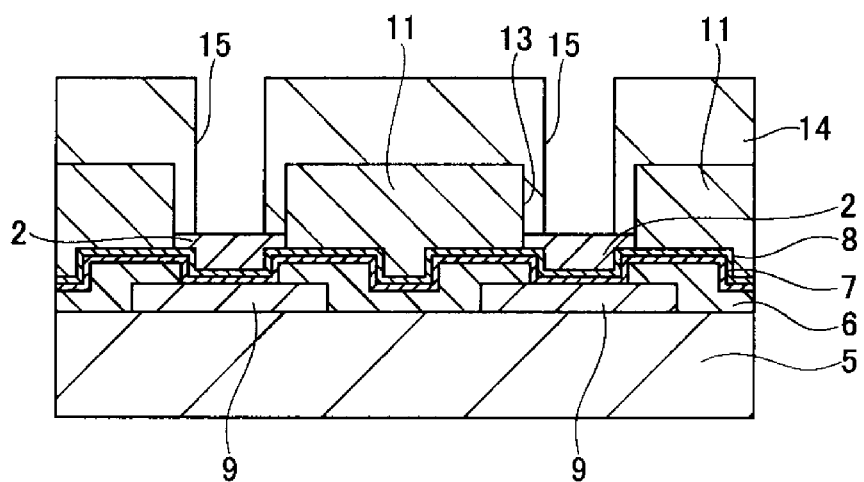
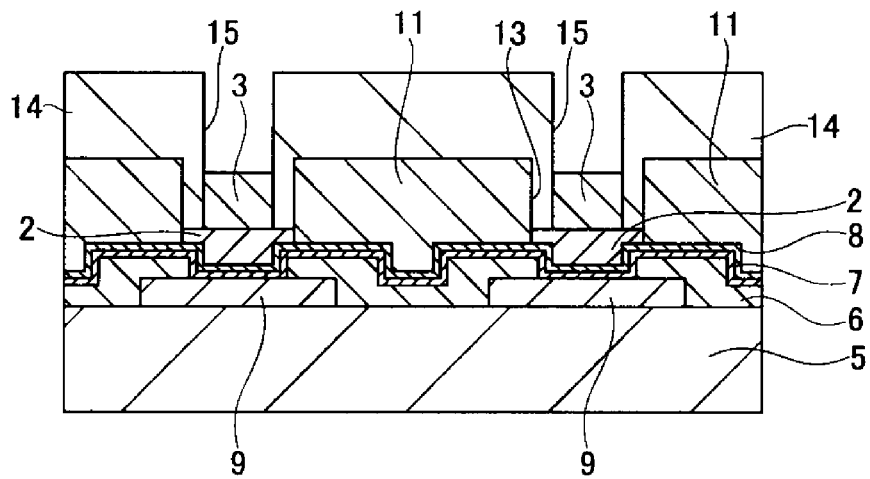

a b

SEMICONDUCTOR DEVICE, METHOD OF MANUFACTURING THE SAME, AND METHOD OF MANUFACTURING WIRING BOARD

BACKGROUND

The present disclosure relates to a semiconductor device in which solder bumps are formed, a method of manufacturing the same, and a method of manufacturing a wiring board.

A chip-on-chip technique for laminating and mounting plural semiconductor chips within a single package, and a chip-on-wafer technique for mounting a semiconductor chip on a semiconductor wafer have been proposed with recent high integration promotion of semiconductor devices. FIG. 9 shows a schematic structure of a cross section of a general solder bump formed in an existing semiconductor device.

As shown in FIG. 9, an existing semiconductor device 205 is composed of a barrier metal layer 201 and a solder layer 202. In this case, the barrier metal layer 201 is made of a high-melting point metallic material and is formed on an electrode pad portion (not shown) of a semiconductor substrate 203. Also, the solder layer 202 is made of a low-melting point material. Ni, Cu or Au, for example, is used as the high-melting point material composing the barrier metal layer 201. Also, the solder layer 202 is formed on an upper portion of the barrier layer 201. Also, Su, In, Bi or the like is used as the low-melting point metallic material composing the solder layer 202. In addition, in the existing solder bump 200, as shown in FIG. 9, the solder layer 202 is generally formed in such a way that an outer diameter thereof becomes approximately equal to or larger than that of the barrier metal layer 201. This technique, for example, is disclosed in Japanese Patent Laid-Open No. Hei 9-97795.

FIGS. 10A and 10B respectively show processes for manufacturing an existing semiconductor device in which two semiconductor devices 205 each having solder bumps 200 formed thereon are joined to each other. In the description which will be given with reference to FIGS. 10A and 10B, the two semiconductor devices 205 which are to be joined to each other are supposed to be semiconductor devices 205a and 206b, respectively.

Firstly, as shown in FIG. 10A, one semiconductor device 205a is mounted onto the other semiconductor device 205b by using a flip chip bonder in such a way that a surface of one semiconductor device 205a having solder bumps 200 formed thereon, and a surface of the other semiconductor device 205b having the solder bumps 200 formed thereon are made to face each other.

After that, as shown in FIG. 10B, the solder bumps 200 facing each other are made to contact each other under a condition in which a temperature is set equal to or higher than a melting point of the solder layer 202, thereby carrying out the connection between the solder bumps 200. At this time, one semiconductor device 205a is made to be close to the other semiconductor device 205b side while a gap defined between the semiconductor devices 205a and 205b is controlled by the flip chip bonder.

SUMMARY

Now, the process for connecting the chips shown in FIGS. 10A and 10B involves such a problem that an inclination and a warpage are caused in the semiconductor device 205a side which is moved by the flip chip bonder due to the mechanical precision and controllability of the flip chip bonder. In addition, a global stepped portion is formed on each of the surfaces of the semiconductor devices 205a and 205b on which the solder bumps 200 are formed in some cases. For this reason, in the phase of the connection between the semiconductor devices 205, as shown in FIGS. 10A and 10B, one semiconductor device 205a is made to obliquely contact the other semiconductor device 205b. As a result, a gap difference is caused between a region, a, in which the gap defined between the semiconductor devices 205a and 20b is wide, and a region, b, in which the gap defined between the semiconductor devices 205a and 20b is narrow. Also, as it stands now, for the purpose of cancelling the gap in difference between the semiconductor devices 205a and 205b, each of the solder layers 202 needs to be formed so as to have a given thickness or more.

In this case, in the region, a, in which the gap defined between the semiconductor devices 205a and 20b facing each other is optimized, as shown in FIG. 11A, the solder layers 202 each made of the low-melting point metal are joined to each other so as not to be crushed so much. However, in the region, b, in which the gap defined between the semiconductor devices 205a and 205b facing each other is narrow, as shown in FIG. 11B, the solder layers 202 are crushed to largely run over from a range of an outer diameter of each of the barrier metal layers 201 each made of the high-melting point metal. When the solder bumps 200 formed on the surfaces of the semiconductor devices 205a and 205b facing each other are formed at a fine pitch, as shown in FIG. 11B, in the region, b, in which the gap is narrow, it is feared that each adjacent two solder layers 202 contact each other to be short-circuited.

In recent years, along with the miniaturization of the devices, it is required to narrow the pitch of the solder bumps 200. For this reason, there is desired a structure in which even when the pitch of the solder bumps 200 is reduced, each adjacent two solder bumps are not short-circuited.

The present disclosure has been made in order to solve the problems described above, and it is therefore desirable to provide a semiconductor device for which in a process for joining semiconductor devices to each other through solder bumps, a joining precision is improved and a yield is enhanced, a method of manufacturing the same, and a method of manufacturing a wiring board.

In order to attain the desire described above, according to an embodiment of the present disclosure, there is provided a semiconductor device including: a solder bump including a barrier metal layer formed on an electrode pad portion of a substrate, and a solder layer formed at a central portion of an upper surface of the barrier metal layer so as to have a smaller outer diameter than that of the barrier metal layer.

According to another embodiment of the present disclosure, there is provided a method of manufacturing a semiconductor device including: forming a barrier metal layer on an upper portion of an electrode pad portion formed on a substrate; and forming a solder layer having a smaller outer diameter than that of the barrier metal layer on an upper portion of the barrier metal layer.

In the semiconductor device of the embodiment, and the method of manufacturing the same of another embodiment, the solder layer is formed so as to have the smaller outer diameter than that of the barrier metal layer. Therefore, when the melted solder layer is crushed, the solder layer thus crushed can be prevented from largely running over from the upper portion of the barrier metal layer.

According to still another embodiment of the present disclosure, there is provided a method of manufacturing a wiring board including: forming a photo resist layer which is opened so as to correspond to a central portion of an electrode pad portion formed on a board; and forming a solder layer on an upper portion of the electrode pad portion through the photo resist layer.

In the method of manufacturing a wiring board of still another embodiment, the solder layer formed on the upper portion of the electrode pad is formed through the patterned photo resist layer. Therefore, the solder layer can be precisely formed in the desired area on the upper portion of the wiring pad portion.

As set forth hereinabove, according to the present disclosure, it is possible to obtain the semiconductor device and the wiring board in each of which the enhancement of the yield, and the improvement in the image quality can be facilitated in the joining between the chips.

BRIEF DESCRIPTION OF THE DRAWINGS

FIGS. 2A to 2K are respectively cross sectional views explaining a method of manufacturing a main portion of the semiconductor device according to the first embodiment of the present disclosure in the order of processes;

DETAILED DESCRIPTION OF THE PREFERRED EMBODIMENTS

Hereinafter, embodiments of a semiconductor device, a method of manufacturing the same, and a method of manufacturing a wiring board will be described in detail with reference to FIG. 1 to FIGS. 8A and 8B. The embodiments of the present disclosure will be described below in accordance with the following order. Here, it is noted that the present disclosure is by no means limited to the embodiments which will be described below.

1. First Embodiment: Semiconductor Device
1-1 Structure of Semiconductor Device
1-2 Method of Manufacturing Semiconductor Device
1-3 Modified Example 1
1-4 Modified Example 2
2. Second Embodiment: Semiconductor Device
3. Third Embodiment: Method of Manufacturing Wiring Board

1. First Embodiment

Semiconductor Device

Firstly, a semiconductor device according to a first embodiment of the present disclosure, and a method of manufacturing the same will be described in detail.

1-1 Structure of Semiconductor Device

Figure 1:
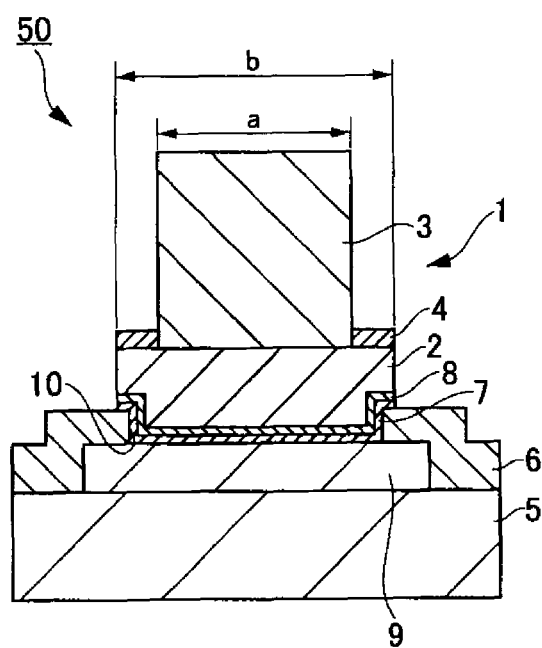
FIG. 1 is a cross sectional view showing a structure of a portion, in which a solder bump is formed, of a semiconductor device according to a first embodiment of the present disclosure.

FIG. 1 shows a cross-sectional structure of a portion, in which a solder bump 1 is formed, of a semiconductor device 50 according to the first embodiment of the present disclosure. As shown in FIG. 1, the semiconductor device 50 of the first embodiment includes an electrode pad portion 9 formed on a circuit surface of a semiconductor substrate 5, and an insulating film (hereinafter referred to as "a passivation film") 6 covering the periphery of the electrode pad portion 9, and the circuit surface of the semiconductor substrate 5. In this case, the solder bump 1 is composed of an adhesion layer 7 and a seed metal layer 8 which are formed on the electrode pad portion 9 in this order, and a barrier metal layer 2 and a seed metal layer 3 which are formed on an upper portion of the seed metal layer 8 in order. In addition, a stopper film 4 is formed on an upper surface of the barrier metal layer 2 composing the solder bump 1.

The electrode pad portion 9, for example, is made of aluminum (Al), and is structured so as to have a desired area on a principal surface, for example, the circuit surface (not shown), of the semiconductor substrate 5 composing the semiconductor device 50.

The passivation film 6, for example, is made of SiN or $SiO_2$. Also, the passivation film 6 is formed so as to have an opening portion 10 through which a central portion of the electrode pad portion 9 is exposed, and so as to cover both of the periphery of the electrode pad portion 9 and the surface of the semiconductor substrate 5.

The adhesion layer 7, for example, is made of Ti and is formed on an upper portion of the electrode pad portion 9 exposed through the passivation layer 6. Also, the provision of the adhesion layer 7 results in that the adhesion between the solder bump 1 and the electrode pad portion 9 is improved.

The seed metal 8, for example, is made of Cu and is formed on the upper portion of the adhesion layer 7. The seed metal 8 is a layer which is provided in order to form the barrier metal layer 2 by utilizing an electrolytic plating method.

The barrier metal layer 2 is formed right above the electrode pad portion 9 through the adhesion layer 7 and the seed metal layer 8 so as to have a smaller area than that of the electrode pad portion 9. The barrier metal layer 2 can be made of a high-melting point metallic material having a higher melting point than that of the material composing the solder layer 3. For example, the barrier metal layer 2 can be made of any of Ni, Cu or Au. A thickness of the barrier metal layer 2 is set in the range of 1 to 10 μm.

The solder layer 3 is formed at the central portion just above the barrier metal layer 2 so as to have a smaller outer diameter than that of the barrier metal layer 2. The solder layer 3 can be made of a low-melting point material having a lower melting point than that of the material composing the barrier metal layer 2. Thus, the solder layer 3, for example, can be made of any one of Sn, In or Bi. Also, the solder layer 3 is formed so as to have a thickness of 2 to 20 μm. In this case, the solder layer 3 is formed in such a way that a ratio in height of the barrier metal layer 2 and the solder layer 3, for example, becomes 2:1.

The stopper film 4 is formed in an area in which the solder layer 3 on the upper surface of the barrier metal layer 2 is not formed, that is, in the periphery of the upper surface of the barrier metal layer 2. The stopper film 4 is a film for suppressing the spreading of the melted solder layer 3 over the upper surface of the barrier metal layer 2 when the solder layer 3 is melted, and thus is made of a material which is poor in wettability for the material of the solder layer 3. In the first embodiment, the stopper film 4, for example, is composed of a $SiO_2$ film.

In the solder bump 1 in the first embodiment, the solder layer 3 made of the low-melting point metallic material is formed in such a way that the outer diameter thereof is smaller than that of the barrier metal layer 2 made of the high-melting point metallic material. For this reason, even when the solder layer 3 is melted to be crushed to spread in a transverse direction (in a direction parallel with the surface of the semiconductor substrate 5), the melted solder layer 3 is prevented from being remarkably run over from the upper surface of the barrier metal layer 2. In addition, the stopper film 4 which is poor in wettability for the material of the solder layer 3 is formed in the area in which the stopper layer 3 on the upper surface of the barrier metal layer 2 is not formed. For this reason, a contact angle between the melted solder layer 3 and the surface of the stopper film 4 is large, and thus the melted solder layer 3 becomes hard to spread in the transverse direction.

1-2 Method of Manufacturing Semiconductor Device

FIGS. 2A to 2K respectively show cross sectional views explaining a method of manufacturing a main portion of the semiconductor device 50 of the first embodiment in the order of processes. The method of manufacturing the main portion of the semiconductor device 50 of the first embodiment will be described in detail below with reference to FIGS. 2A to 2K.

Figure 2A:
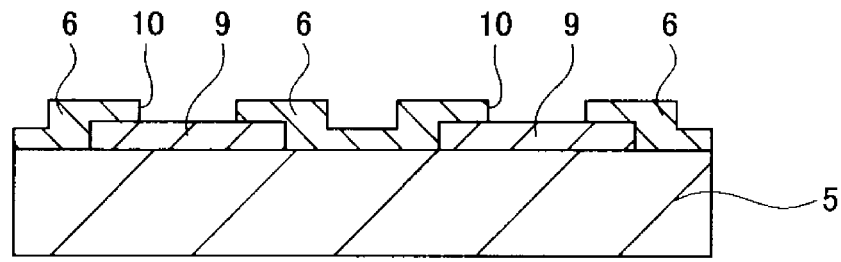

Firstly, as shown in FIG. 2A, the semiconductor substrate 5 is prepared, and the electrode pad portion 9 made of aluminum is formed on the circuit surface of the upper portion of the semiconductor substrate 5. Next, the passivation film 6 having the opening portion 10 through which the central portion of the electrode pad portion 9 is exposed is formed so as to cover both of the periphery of the electrode pad portion 9 and the upper portion of the semiconductor substrate 5. After that, the exposed surface of the electrode pad portion 9 is cleaned by utilizing a plasma etching method using an Ar gas.

Figure 2B:
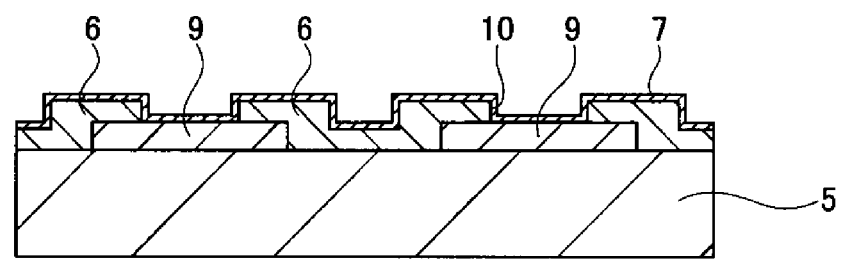

Next, as shown in FIG. 2B, the adhesion layer 7 made of Ti and having a thickness of about 100 to about 500 nm is formed by utilizing a sputtering method. The adhesion layer 7 is a layer which is provided in order to increase the adhesion between the electric pad portion 9 and the solder bump 1.

Figure 2C:
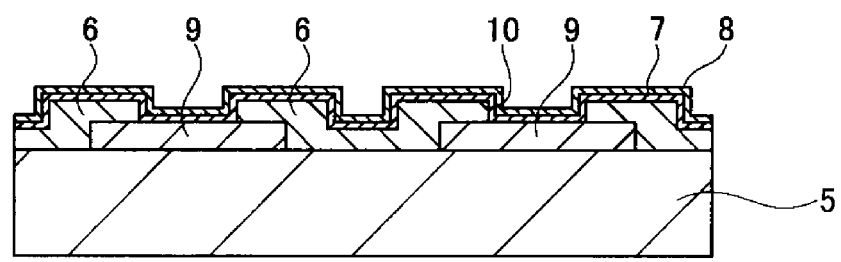

Next, as shown in FIG. 2C, the seed metal layer 8 made of Cu and having a thickness of about 100 to about 1,000 nm is formed by utilizing a sputtering method. The seed metal layer 8 is a layer for reducing a resistance, and functions as a seed metal in an electrolytic plating method which will be utilized in the later process.

Figure 2D:
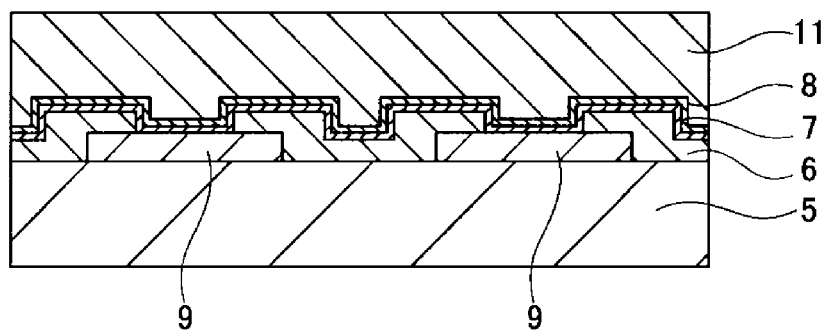

Next, as shown in FIG. 2D, a first photo resist layer 11 is formed over the entire surface on the front surface side of the semiconductor substrate 5 by utilizing an application method.

Figure 2E:
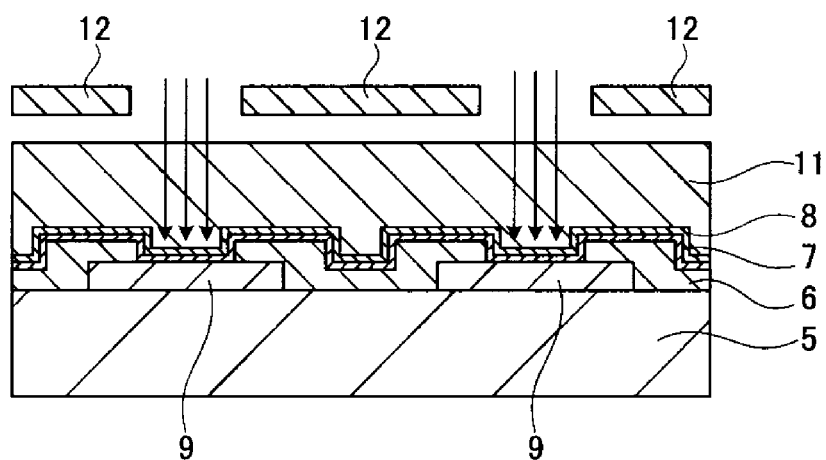

Next, as shown in FIG. 2E, a mask 12 in which an area slightly larger than that of the electrode pad portion 9 which is exposed through the passivation film 6 in the processes shown in FIG. 2A is opened is formed on the upper portion of the first photo resist layer 11, and exposure is then carried out.

Figure 2F:
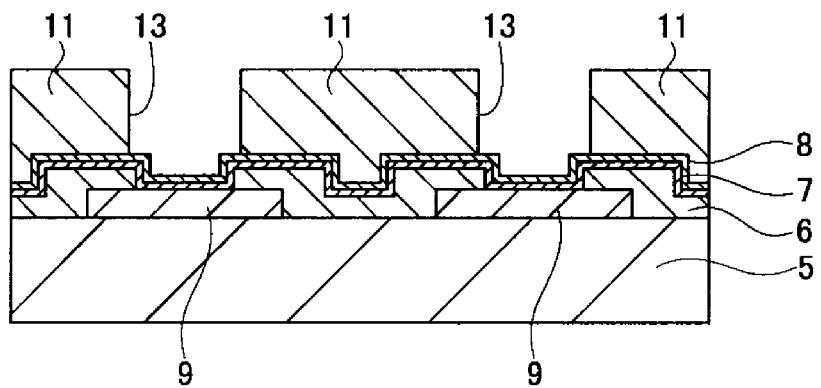

Next, carrying out development, whereby as shown in FIG. 2F, the portion of the first photo resist layer 11 which has been exposed is removed away, so that an opening portion 13 through which the central portion of the seed material layer 8 is exposed is formed. After that, the upper portion of the seed metal layer 8 thus exposed is subjected to a descum treatment by using oxygen and an Ar gas.

Next, as shown in FIG. 2G, the barrier metal layer 2 made of Ni is formed on the upper portion of the seed metal layer 8 by utilizing an electrolytic plating method so as to have a thickness of, for example, 1 to 10 μm.

Next, a second photo resist layer 14 is further formed so as to cover both of the upper surface of the barrier metal layer 2, and the entire surface of the first photo resist layer 11. In the second photo resist layer 14, a mask in which an opening having an outer diameter smaller than that of the barrier metal layer 2 is formed just above the barrier metal layer 2 is formed on the upper portion of the second photo resist layer 14, and the exposure is then carried out.

Next, by carrying out the development, as shown in FIG. 2H, the exposed portion of the second photo resist layer 14 is removed away, and thus an opening portion 15 through which the central portion of the barrier metal layer 2 is exposed is formed. An area of the central portion of the barrier metal layer 2 which is exposed through the opening portion 15 is smaller than that of the barrier metal layer 2.

Next, as shown in FIG. 2I, the solder layer 3 made of Sn is formed on the upper portion of the barrier metal layer 2 thus exposed by utilizing an electrolytic plating method so as to have a thickness of, for example, 2 to 20 μm.

Figure 2J:
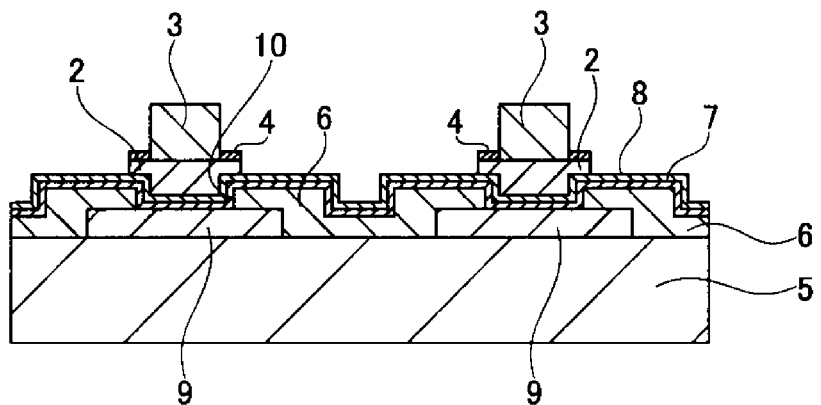
Figure 2K:
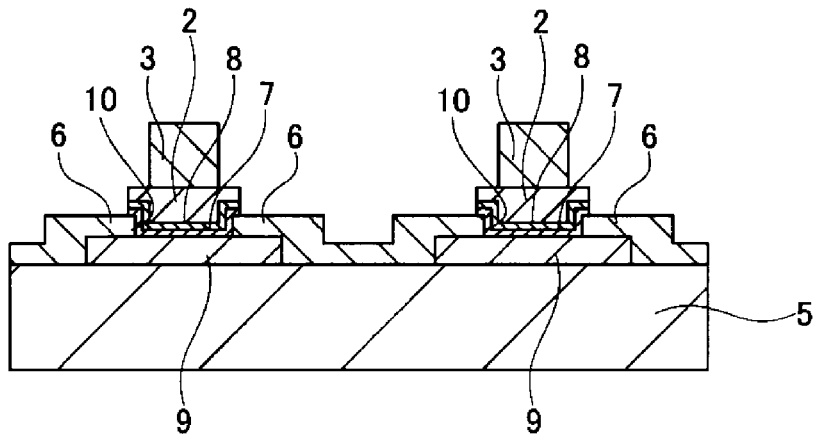

Next, as shown in FIG. 2J, the first and second photo resist layers 11 and 14 are removed away in an ashing process using an $O_2$ gas. By carrying out the ashing process, an oxide film of Ni becoming the stopper film 4 is formed on the upper surface of the barrier metal layer 2 thus exposed. This oxide film of Ni is a film which is poor in wettability for the solder layer 3. Thus, this oxide film of Ni is used as the stopper film 4 for preventing the melted solder layer 3 from flowing in the transverse direction. After that, the exposed portion of the seed metal layer 8 is removed away by utilizing a wet etching method, and subsequently, the exposed portion of the adhesion layer 7 is removed away by utilizing the wet etching method.

In the first embodiment, the semiconductor device 50 having the solder bumps 1 formed therein is manufactured in the manner as described above.

Figure 3A:
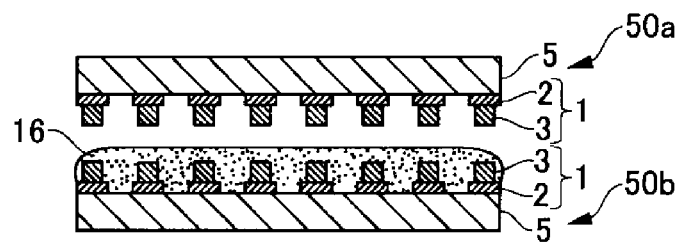
FIGS. 3A and 3B are respectively cross sectional views explaining processes for joining the two semiconductor devices each manufactured in the first embodiment of the present disclosure through solder bumps.
Figure 3B:
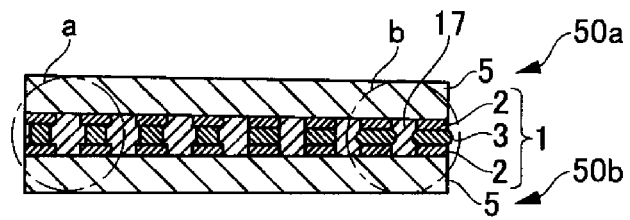

Next, a description will be given with respect to processes for connecting the two semiconductor devices 50 each including the solder bumps 1 formed in the first embodiment to each other. FIGS. 3A and 3B are respectively cross sectional views explaining processes for joining the two semiconductor devices 50 each manufacturing in the first embodiment to each other through the solder bumps. In FIGS. 3A and 3B, only the semiconductor substrate 5 and the solder bumps 1 each composed of the barrier metal layer 2 and the solder layer 3 and formed on the semiconductor substrate 5 are illustrated in the semiconductor device 50, and other constituent portions are omitted here for the same of simplicity.

The two semiconductor devices 50 each including the solder bumps 1 described above are prepared. In the following description, when the two semiconductor devices 50 are distinguished from each other, the two semiconductor devices 50 are referred to as the upper side semiconductor device 50a and the lower side semiconductor device 50b, respectively, in the description. On the other hand, when the two semiconductor devices 50 are not distinguished from each other, the two semiconductor devices 50 are collectively referred to as the semiconductor devices 50 in the description.

Firstly, as shown in FIG. 3A, one semiconductor device (hereinafter referred to as the lower side semiconductor device) 50b is installed in a stage provided within a flip chip bonder apparatus (not shown) in such a way that the solder bumps 1 of the lower side semiconductor device 50b are directed upward. Next, a flux 16 is applied so as to cover the solder bumps 1 of the lower side semiconductor device 50b. Also, the other semiconductor device (hereinafter referred to as the upper side semiconductor device) 50a is mounted onto the upper portion of the lower side semiconductor device 50b by using a suction head (not shown) of the flip chip bonder apparatus (not shown) in such a way that the solder bumps 1 of the upper side semiconductor device 50a, and the solder bumps 1 of the lower side semiconductor device 50b face each other. As a result, the lower side semiconductor device 50b and the upper side semiconductor device 50a are fixed to each other by utilizing an adherence property of the flux 16.

Next, a reflow furnace (not shown) is loaded with the lower side semiconductor device 50b and the upper side semiconductor device 50a which have been fixed to each other. Then, the lower side semiconductor device 50b and the upper side semiconductor device 50a are subjected to the heating and cooling treatments within the reflow furnace, whereby the solder layers 3 of the upper side semiconductor device 50a and the lower side semiconductor device 50b are melted and adhered to each other to be solidified in this stare. As a result, the soldering is completed.

Next, after the flux 16 remaining in the space defined between the upper side semiconductor device 50a and the lower side semiconductor device 50b thus soldered has been removed away, a thermosetting resin is filled in a space defined between the upper side semiconductor device 50a and the lower side semiconductor device 50b by utilizing a capillary phenomenon, and is then cured. As a result, as shown in FIG. 3B, an underfill layer 17 is formed. The forming of the underfill layer 17 results in that the joining portions of the solder layers 3 of the upper side semiconductor device 50a and the lower side semiconductor device 50b can be protected from the external stress, and the short-circuit which may be caused after the joining can be prevented from being caused.

In such a way, the upper side semiconductor device 50a and the lower side semiconductor device 50b are electrically connected to each other through the solder bumps 1.

Figure 7A:
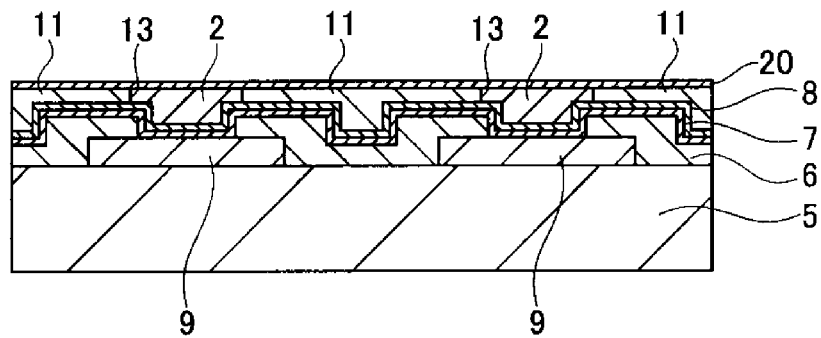
FIGS. 7A to 7F are respectively cross sectional views explaining a method of manufacturing a main portion of a semiconductor device according to a second embodiment of the present disclosure.
Figure 7B:
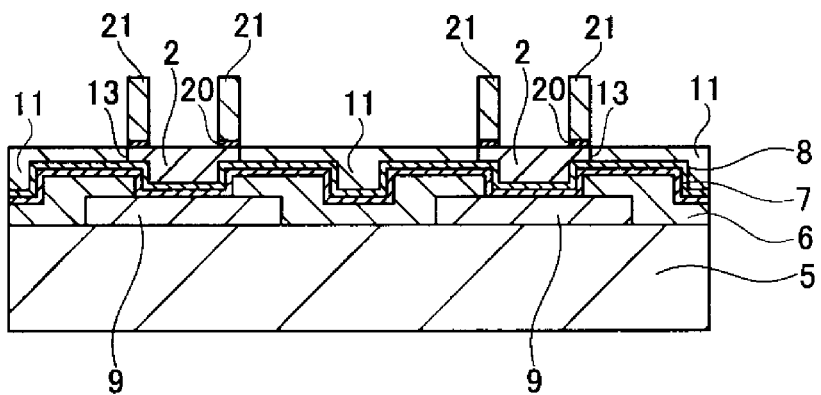

Now, as described above, due to the inclination and warpage of the upper side semiconductor device 50a resulting from the flip chip bonder, or the global stepped portion of the semiconductor device 50, a difference is caused in size of the gap between the upper side semiconductor device 50a and the lower side semiconductor device 50b in the phase of the joining in some cases. FIG. 7A is an enlarged cross sectional view showing a cross section in a region in which the gap is wide (corresponding to a portion, a, shown in FIG. 3B). Also, FIG. 7B is an enlarged cross sectional view showing a cross section in a region in which the gap is narrow (corresponding to a portion, b, shown in FIG. 3B).

Figure 4A:
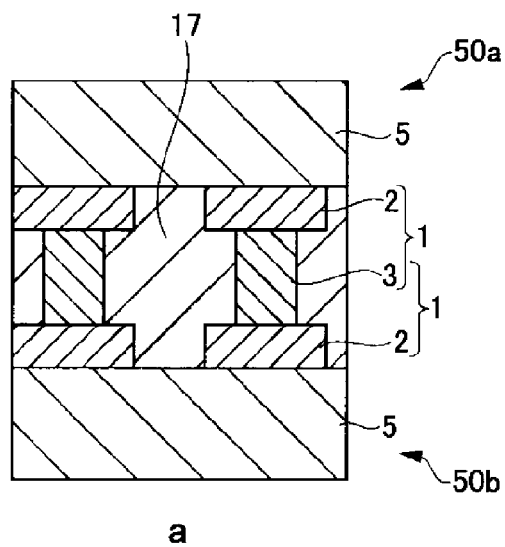
FIGS. 4A and 4B are respectively an enlarged cross sectional view showing a cross section in a region having a wide gap (corresponding to an "a" in FIG. 3B), and an enlarged cross sectional view showing a cross section in a region having a narrow gap (corresponding to a "b" in FIG. 3B)
Figure 4B:
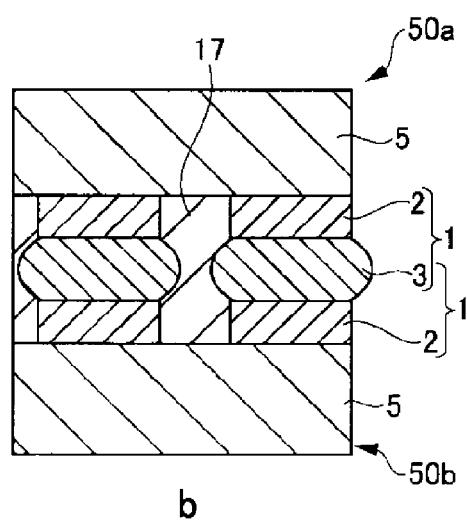

Due to the mechanical precision of the current flip chip bonder, and the global stepped portion of the semiconductor device 50, the gap difference which, for example, is in the range of ±3 to 5 μm is caused in the region between the upper side semiconductor device 50a and the lower side semiconductor device 50b. As a result, there is a restriction that the height of the solder layer 3 needs to be set at a height capable of coping with the gap difference, and also the height of the solder layer 3 needs to be set equal to or larger than a given value. In the first embodiment, it is possible to form the bump 1 in which the height (in the range of 2 to 20 μm in the first embodiment) of the solder layer in the existing solder bump is maintained. For this reason, as shown in FIGS. 4A and 4B, the joining can be reliably carried out over the entire region including the portions different in gap from each other in the phase of the joining between the upper side semiconductor device 50a and the lower side semiconductor device 50b.

Also, in the first embodiment, in the solder bump 1, the solder layer 3 is formed in such a way that the outer diameter thereof becomes smaller than that of the barrier metal layer 2. In addition thereto, the stopper film 4 is formed in the area in which the solder layer 3 on the upper surface of the barrier metal layer 2 is not formed. As a result, even when the melted solder layer 3 is crushed in the region in which the gap is narrow in the phase of the joining between the upper side semiconductor device 50a and the lower side semiconductor device 50b, the melted solder layer 3 is prevented from remarkably spreading in the transverse direction. For this reason, as shown in FIG. 4B, even when the solder layer 3 is melted to be crushed in the region in which the gap is narrow, each adjacent two solder bumps 1 can be prevented from contacting each other.

Also, the semiconductor device 50 of the first embodiment adopts the structure in which the solder layer 3 is hard to spread in the transverse direction. Therefore, even when the distance between each adjacent two solder bumps 1 becomes small by narrowing the pitch of the solder bumps 1, each adjacent two solder bumps 1 can be prevented from contacting each other in the phase of the joining.

As has been described, by forming the solder bumps 1 in the semiconductor device 50 of the first embodiment, even when the chip-on-chip or chip-on-wafer structure is adopted, the joining can be reliably carried out, and it is possible to prevent the short-circuit from being caused between each adjacent two solder bumps 1. As a result, in the joining between the chips, the improvement in the yield and the quality can be realized.

It is noted that although in the case described above with reference to FIGS. 3A and 3B, after the solder layers 3 of the upper side semiconductor device 50a and the lower side semiconductor device 50b has been joined to each other, the underfill layer 17 is formed, a structure may also be adopted such that the underfill layer 17 is formed concurrently with the joining. In this case, an underfill layer made of a thermosetting resin having a flux function is applied so as to cover the solder bumps 1 of the lower side semiconductor device 50b, and the upper side semiconductor device 50a is mounted onto the lower side semiconductor device 50b. Also, the heating is carried out at a temperature equal to or higher than the melting point of the solder layer 3, and lower than a curing start temperature of the thermosetting resin, whereby the solder layers 3 of the upper side semiconductor device 50a and the lower side semiconductor device 50b are joined to each other, and is then cooled to be solidified. After that, the heating is carried out at a temperature equal or higher than a heat curing start temperature of the thermosetting resin, whereby the thermosetting resin is cured, thereby forming the underfill layer.

As has been described, the first embodiment of the present disclosure can be applied to the various kinds of joining methods.

Now, in the first embodiment of the present disclosure, the semiconductor devices 50 of the first embodiment is used as at least one semiconductor device of the two semiconductor devices to be joined to each other, whereby it is possible to enhance the joining precision in the phase of the joining.

1-3 Modified Example 1

Figure 5A:
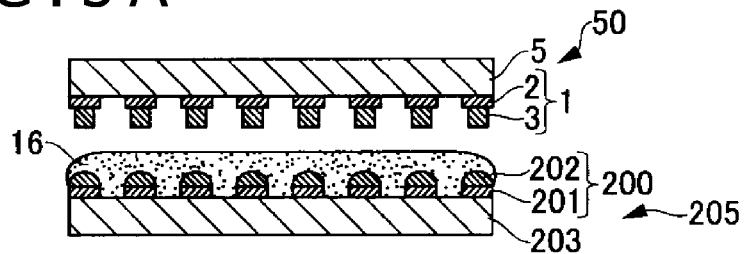
FIGS. 5A and 5B are respectively cross sectional views explaining processes for joining two semiconductor devices to each other according to Modified Example 1 of the first embodiment of the present disclosure.
Figure 5B:
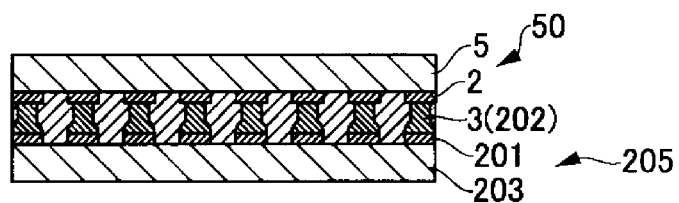
Figure 9:
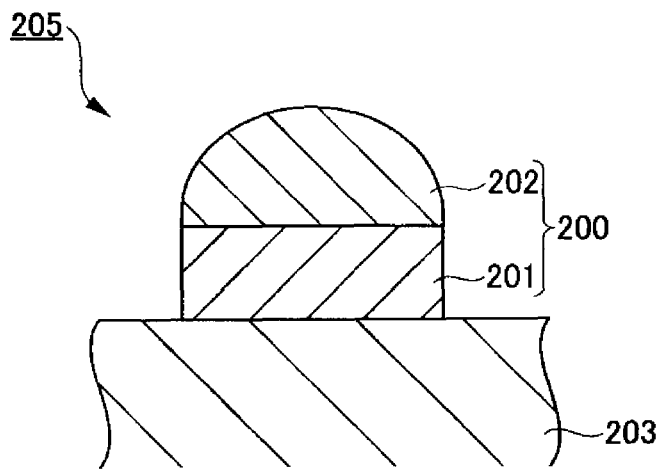
FIG. 9 is a schematic cross sectional view showing a structure of a cross section of a general solder bump formed in an existing semiconductor device.
Figure 10A:
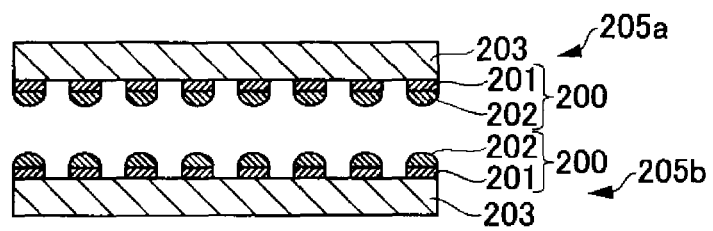
FIGS. 10A and 10B are respectively cross sectional views explaining processes for joining existing two semiconductor devices through solder bumps.
Figure 10B:
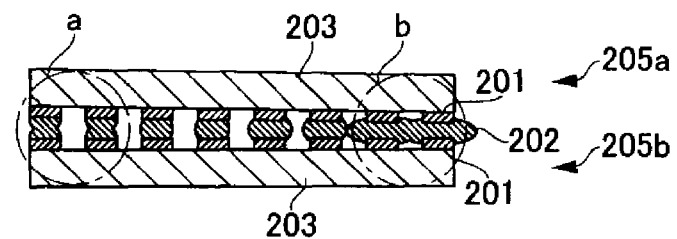
Figure 11A:
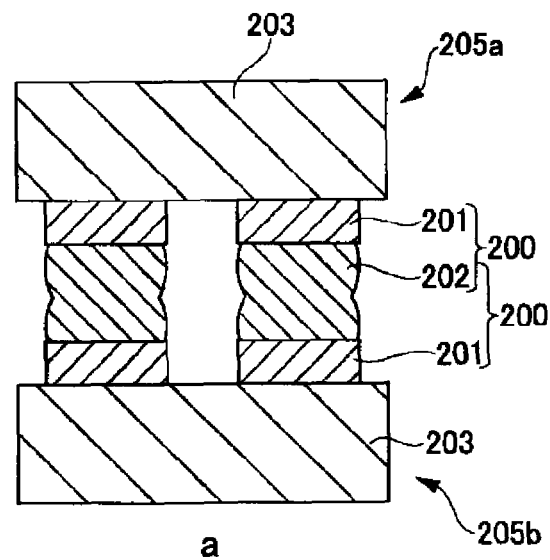
FIGS. 11A and 11B are respectively an enlarged cross sectional view showing a structure of a region having a wide gap, and an enlarged cross sectional view showing a structure of a region having a narrow gap.
Figure 11B:
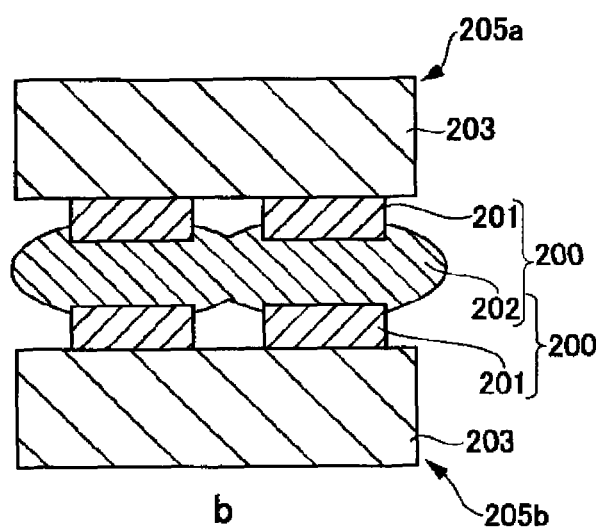

FIGS. 5A and 5B are respectively cross sectional views explaining a process for joining the two semiconductor devices to each other according to Modified Example 1 of the first embodiment to each other. In Modified Example 1, a description will be given below with respect to the case where the semiconductor device 50 having the solder bumps 1 formed in the first embodiment, and the semiconductor device 205 having the existing solder bumps 200 (refer to FIG. 9) are joined to each other.

As shown in FIG. 5A, in Modified Example 1, a semiconductor device on a side undergoing the mounting (hereinafter referred to as "a lower side semiconductor device") 205 is made a semiconductor device on which the existing slider bumps 200 are formed. In addition, a semiconductor device on a mounting side (hereinafter referred to as "an upper side semiconductor device 50") is made the semiconductor device of the first embodiment.

In the lower side semiconductor device 205, plural solder bumps 200 each composed of the barrier metal layer 201, and the solder layer 202 are formed on the upper portion of the semiconductor substrate 203. In this case, the solder layer 202 is formed so as to have the outer diameter comparable to that of the barrier metal layer 201. In Modified Example 1 as well, similarly to the case of FIG. 3A, after the flux 16 has been applied onto the lower side semiconductor device 205, the upper side semiconductor device 50 is mounted onto the lower side semiconductor device 205, and the solder layers 3 of the upper side semiconductor device 50, and the solder layers 202 of the lower side semiconductor device 205 are melted to be joined to each other in a reflow furnace (not shown). As a result, as shown in FIG. 5B, the lower side semiconductor device 205 and the upper side semiconductor device 50 are joined to each other.

In Modified Example 1 as well, since the solder layer 3 in the solder bump 1 formed on the upper side semiconductor device 50 is hard to spread in the transverse direction, it is possible to prevent the short-circuit from being caused between each adjacent two solder bumps 1 (200). As has been described, even when the semiconductor device of the first embodiment is used as any one of the two semiconductor devices to be joined to each other, it is possible to obtain the same effects as those of the first embodiment.

1-4 Modified Example 2

Figure 6A:
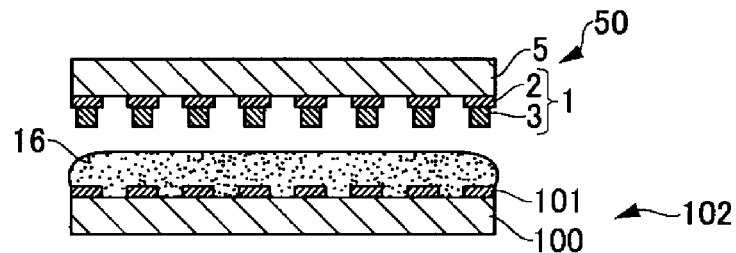
FIGS. 6A and 6B are respectively cross sectional views explaining processes for joining a semiconductor device and a wiring board to each other according to Modified Example 2 of the first embodiment of the present disclosure.
Figure 6B:
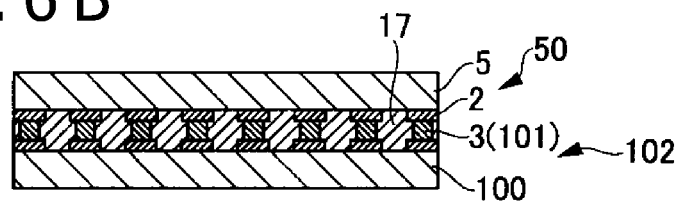

Next, FIGS. 6A and 6B are respectively cross sectional views explaining a process for joining the semiconductor device and a wiring board to each other according to Modified Example 2 of the first embodiment. In Modified Example 2, a description will be given below with respect to the case where the semiconductor device 50 having the solder bumps 1 formed in the first embodiment is joined to a wiring board 102. As shown in FIG. 6A, in Modified Example 2 of the first embodiment, the wiring board 102 is disposed on a side undergoing the mounting, and the semiconductor device 50 on which the solder bumps 1 in the first embodiment are formed is used on a mounting side.

The wiring board 102 adopts a structure in which wiring lands 101 are formed on a circuit surface side of a board 100 and a portion of an upper surface of the board 100 other than a portion of the upper surface of the board 100 on which the wiring lands 100 are formed is covered with an insulating film (not shown) made of a solder resist. In Modified Example 2 as well, similarly to the case of FIG. 3A, the semiconductor device 50 is mounted onto the wiring board 102 in such a way that the solder bumps 1 face the exposed wiring lands 101 on the wiring board 102, respectively, and the solder layers 3 are then melted to be joined to the wiring lands 101, respectively. As a result, the wiring board 102 and the semiconductor device 50 are joined to each other.

In Modified Example 2 as well, since the solder layer 3 in the solder bump 1 formed on the semiconductor device 50 is hard to spread in the transverse direction, it is possible to prevent the short-circuit from being caused between each adjacent two solder bumps 1.

In addition thereto, it is possible to obtain the same effects as those of the first embodiment.

2. Second Embodiment

Semiconductor Device

Next, a semiconductor device according to a second embodiment of the present disclosure, and a method of manufacturing the same will be described in detail. In the case of the second embodiment, the stopper film is made of a metallic material which is poor in wettability for the solder layer.

The method of manufacturing the semiconductor device according to the second embodiment will be described in detail hereinafter with reference to FIGS. 7A to 7F. Since the processes up to the process for forming the barrier metal layer 2 are the same as those shown in FIGS. 2A to 2G, respectively, a repeated description is omitted here for the sake of simplicity. Note that, at this time, the first photo resist layer 11 is preferably formed so as to have the same height as that of the barrier metal layer 2 formed.

After completion of the formation of the barrier metal layer 2, as shown in FIG. 7A, a metallic material layer composing the stopper layer 20 is formed over the entire surface including the upper surface of the barrier metal layer 2. All it takes is that the metallic material layer composing the stopper layer 20 is a material which is poor in wettability for the solder layer 3. For example, a metallic material of any one of Ti, W or Ta, or an alloy such as TiN, TiW, TiON or TiN can be used in the metallic material layer composing the stopper layer 20.

After that, as shown in FIG. 7B, a second photo resist layer 21 is formed so as to cover only a portion in which the stopper film 20 is left, and the metallic material layer in an exposed portion is then removed away. As a result, the stopper layer 20 is formed only in the periphery of the barrier metal layer 2.

Figure 7C:
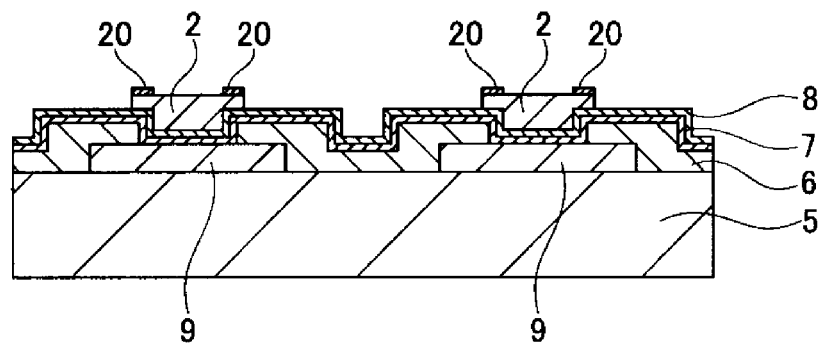

Next, as shown in FIG. 7C, the first and second photo resist layers 11 and 21 are both removed away.

Figure 7D:
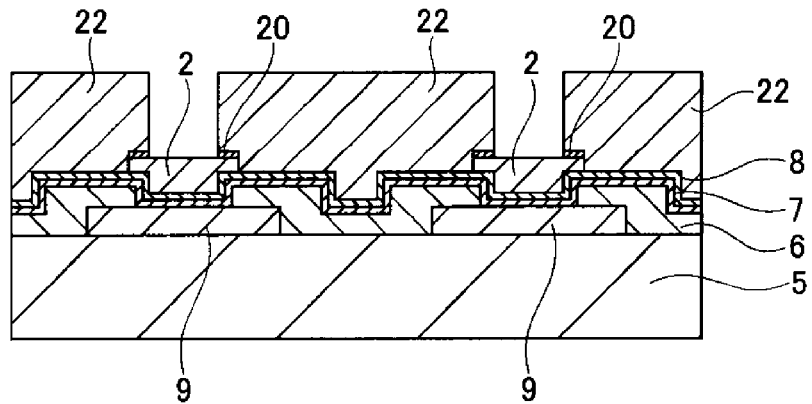
Figure 7E:
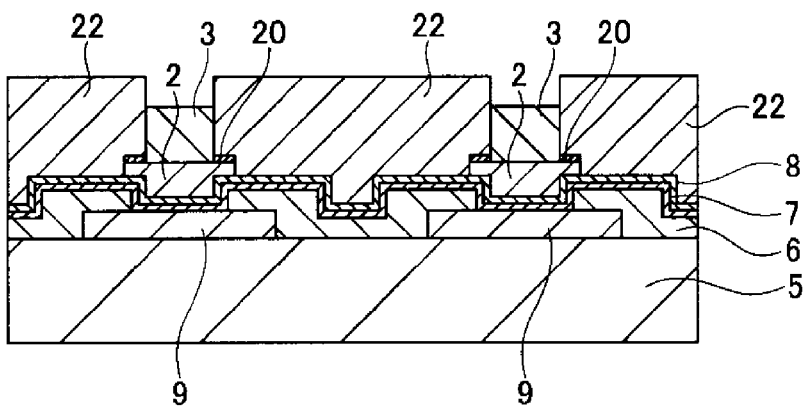

Next, as shown in FIG. 7D, similarly to the case of FIG. 2H, a third photo resist layer 22 is formed which is opened so as to correspond to only a portion in which the solder layer 3 is to be formed. After that, as shown in FIG. 7E, the solder layer 3 made of Sn is formed on an upper portion of the barrier metal layer 2 exposed through the opening of the third photo resist layer 22 so as to have a thickness of 2 to 10 μm by utilizing an electrolytic plating method.

Figure 7F:
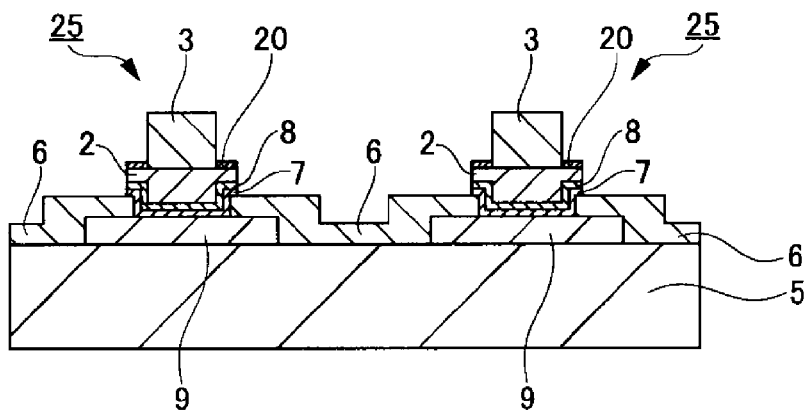

After that, as shown in FIG. 7F, the third photo resist layer 22 is removed away, and the second metal layer 8 and the adhesion layer 7 are both removed away similarly to the case of the first embodiment, thereby forming the solder bump 1 above the semiconductor substrate 5.

In the semiconductor device 25 as well of the second embodiment, since in the solder bump 1, the solder layer 3 is formed in such a way that the outer diameter thereof becomes smaller than that of the barrier metal layer 2, even when the pitch of the solder bumps 1 is narrowed, the short-circuit between each adjacent two solder bumps 1 is reduced.

In addition, in the semiconductor device 25 of the second embodiment, since the stopper film 20 is made of the metallic material, the solder layer 3 becomes hard to wet and spread as compared with the case where the stopper film 20 is made of the oxide film.

In addition thereto, it is possible to obtain the same effects as those of the first embodiment.

Although in the second embodiment, the stopper film is made of the metallic material before formation of the solder layer, the oxide film can be formed as the stopper film in the same process. That is to say, the stopper film composed of the oxide film may be formed in the process before formation of the solder layer, and may be patterned in the same processes as those in FIGS. 7A to 7F. The stopper film composed of the oxide film is formed in a process different from the ashing process instead of being formed in the ashing process as with the first embodiment, whereby it is possible to reliably form the stopper film.

3. Third Embodiment

Method of Manufacturing Wiring Board

Next, a method of manufacturing a wiring board according to a third embodiment of the present disclosure will be described in detail with reference to FIGS. 8A to 8D. In the case of the third embodiment, a solder layer is formed through the patterning on an electrode pad portion (hereinafter referred to as "a wiring land") formed on a printed wiring board. FIGS. 8A to 8D are respectively cross sectional views explaining the method of manufacturing the wiring board according to the third embodiment of the present disclosure.

Figure 8A:
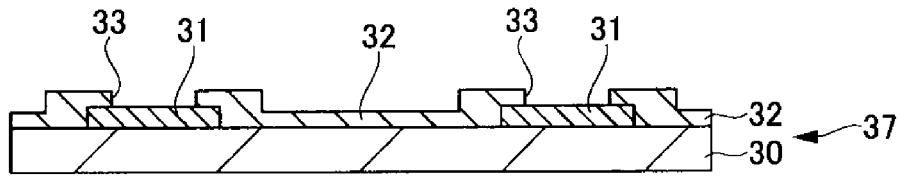
FIGS. 8A to 8D are respectively cross sectional views explaining a method of manufacturing a main portion of a wiring board according to a third embodiment of the present disclosure in the order of processes.

Firstly, as shown in FIG. 8A, a printed wiring board 37 is prepared. In this case, the printed wiring board 37 has a board 30 on which a desired circuit is formed, and an opening portion 33 through which an area in which a wiring land 31 on an upper surface of the board 30 is formed is exposed. Also, a solder mask 32 covering the entire surface of the board 30 is formed in the printed wiring board 37. In the third embodiment, the wiring land 31 is made of copper.

Figure 8B:
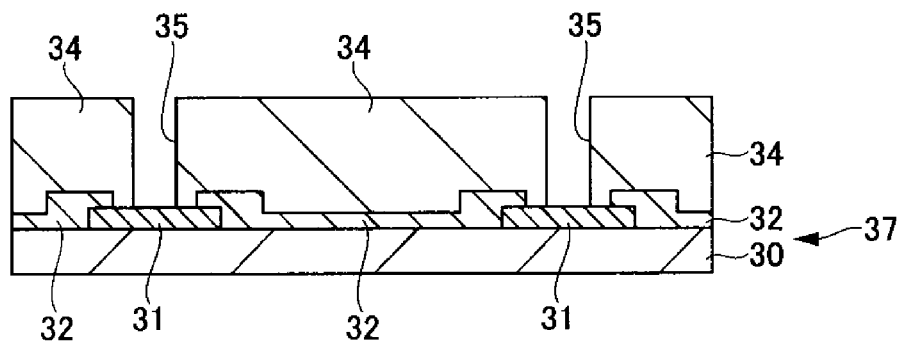

Next, as shown in FIG. 8B, a photo resist layer 34 having an opening portion 35 through which a central portion of the wiring land 31 is exposed is formed over the entire surface of the board 30.

Figure 8C:
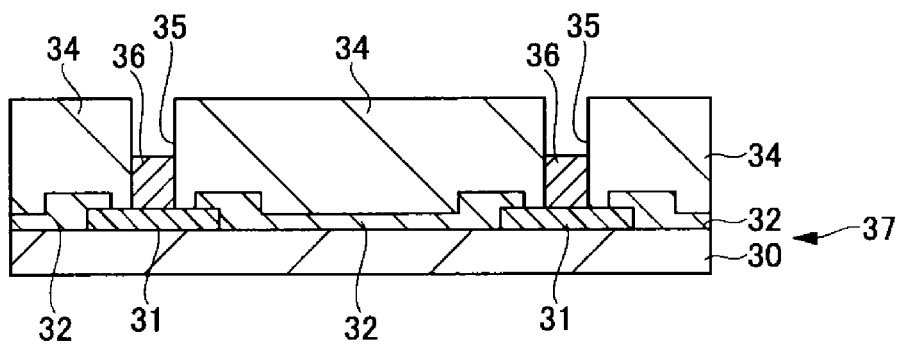
Figure 8D:
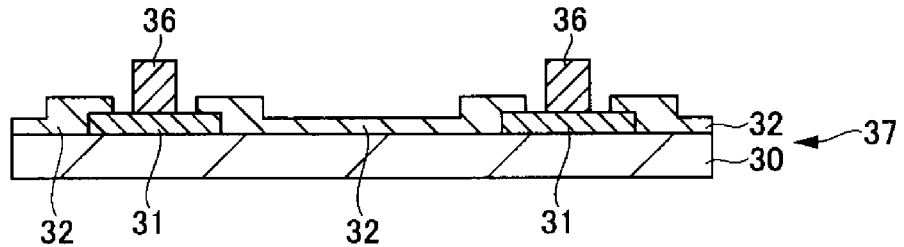

Next, as shown in FIG. 8C, a solder layer 36 is formed on the wiring land 31 exposed through the photo resist layer 34 by utilizing an electrolytic plating method. As a result, the solder layer 36 is formed at the central portion of the exposed wiring land 31 so as to have a smaller diameter than that of the wiring land 31. After that, as shown in FIG. 8D, the photo resist layer 34 is removed away, thereby completing the printed wiring board in which the solder layer 36 is formed.

In the third embodiment, in the printed wiring board 37, the solder layer 36 can be formed on the portion exposed through the opening portion 35 of the photo resist layer 34. Therefore, the outer diameter of the solder layer 36 can be made smaller than that of the wiring land 31, and also the solder layer 36 can be precisely formed so as to have the predetermined diameter. As a result, even when, for example, the semiconductor device 50 of the first embodiment is joined to the printed wiring board 37, it is possible to prevent the short-circuit from being caused between each adjacent two solder layers.

In addition thereto, it is possible to obtain the same effects as those of the first embodiment.

Although the present disclosure has been described so far based on the first to third embodiments, the present disclosure is by no means limited thereto, and thus various changes can be made without departing from the subject matter of the present disclosure. In addition, the constitutions of the first to third embodiments can also be combined with each other.

It is noted that the present disclosure can also adopt the following constitutions.

(1) A semiconductor device including: a solder bump including a barrier metal layer formed on an electrode pad portion of a substrate, and a solder layer formed at a central portion of an upper surface of the barrier metal layer so as to have a smaller outer diameter than that of the barrier metal layer.

(2) The semiconductor device described in the paragraph (1) in which a stopper film made of a material which is poor in wettability for the solder layer melted is formed on a surface on which the solder layer on the upper surface of the barrier metal layer is not formed.

(3) The semiconductor device described in the paragraph (2) in which the stopper film is composed of an oxide film.

(4) The semiconductor device described in the paragraph (2) in which the stopper film is made of a metallic material.

(5) A method of manufacturing a semiconductor device including: forming a barrier metal layer on an upper portion of an electrode pad portion formed on a substrate; and forming a solder layer having a smaller outer diameter than that of the barrier metal layer on an upper portion of the barrier metal layer.

(6) The method of manufacturing a semiconductor device described in the paragraph (5) in which the barrier metal layer is formed through a first photo resist layer which is opened so as to correspond to a central portion of the electrode pad, and the solder layer is formed through a second photo resist layer which is opened so as to correspond to a central portion of the barrier metal layer and which has the opening having a smaller inner diameter than that of the opening of the first photo resist layer.

(7) The method of manufacturing a semiconductor device described in the paragraph (6), further including: forming a stopper film made of a material which is poor in wettability for the solder layer on an area, of an upper surface of the barrier material layer, on which no solder layer is formed.

(8) The method of manufacturing a semiconductor device described in the paragraph (7), further including: removing the first and second photo resist layers by carrying out ashing, in which the stopper film is composed of an oxide film which is formed on the upper surface of the barrier metal layer by carrying out the ashing.

(9) The method of manufacturing a semiconductor device described in the paragraph (7) in which the stopper film is formed in a periphery of the upper surface of the barrier metal layer before the solder layer is formed.

(10) The method of manufacturing a semiconductor device described in the paragraph (9) in which the stopper film is made of a metallic material.

(11) A method of manufacturing a wiring board including: forming a photo resist layer which is opened so as to correspond to a central portion of an electrode pad portion formed on a board; and forming a solder layer on an upper portion of the electrode pad portion through the photo resist layer.

The present disclosure contains subject matter related to that disclosed in Japanese Priority Patent Application JP 2011-064837 filed in the Japan Patent Office on Mar. 23, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a barrier metal layer between a solder layer and a seed metal layer, said seed metal layer touching a surface of the barrier metal layer;
   a stopper film from the group consisting of an oxide and a metal, said stopper film and said solder layer touching another surface of the barrier metal layer,
   wherein said barrier metal layer is between said seed metal layer and said stopper film, said stopper film touching said solder layer,
   wherein said stopper film is a silicon oxide.

2. A method of manufacturing a semiconductor device, the method comprising:
   a step (a) of forming a first photo resist opening through a first photo resist layer, said first photo resist opening exposing a seed metal layer;
   a step (b) of depositing a barrier metal layer into said first photo resist opening, said barrier metal layer being deposited onto said seed metal layer during the step (b);
   a step (c) of forming a second photo resist opening through a second photo resist layer, said second photo resist opening exposing said barrier metal layer;
   a step (d) of depositing a solder layer into said second photo resist opening, said solder layer being deposited onto a surface of the barrier metal layer during the step (d);
   a step (e) of depositing a stopper film onto a surface of the barrier metal layer, said solder layer touching said stopper film after the step (e),
   wherein the step (d) is performed before the step (e).

3. The method of claim 2, wherein during the step (c), the method further comprising:
   a step of depositing said second photo resist layer onto said first photo resist layer and said barrier metal layer, a portion of the second photo resist layer within said first photo resist opening being removed to form said second photo resist opening.

4. The method of claim 2, wherein said stopper film is from the group consisting of an oxide and a metal.

5. The method of claim 4, wherein said stopper film is said oxide.

6. The method of claim 4, wherein said stopper film contains said metal.

7. The method of claim 2, wherein said stopper film is an oxide of nickel.

8. The method of claim 4, wherein said stopper film is a silicon oxide.

9. The method of claim 2, wherein said seed metal layer touches another surface of the barrier metal layer during the step (b).

10. A semiconductor device comprising:
    a barrier metal layer between a solder layer and a seed metal layer, said seed metal layer touching a surface of the barrier metal layer;
    a stopper film from the group consisting of a silicon oxide and an oxide of nickel, another surface of the barrier metal layer touching said solder layer and said stopper film.

11. The semiconductor device according to claim 10, wherein said barrier metal layer is between said seed metal layer and said stopper film, said stopper film touching said solder layer.

12. The semiconductor device according to claim 10, wherein said barrier metal layer is from the group consisting of nickel, copper, and gold.

13. The semiconductor device according to claim 10, wherein said stopper film is said silicon oxide.

14. The semiconductor device according to claim 10, wherein said stopper film is said oxide of nickel.

15. The semiconductor device according to claim 10, wherein a metal in the barrier metal layer differs from a metal in the solder layer, a metal in the seed metal layer differing from said metal in the barrier metal layer.

16. The semiconductor device according to claim 10, further comprising:
    a passivation film in physical contact with said semiconductor substrate and said electrode pad portion, said adhesion layer being in physical contact with said passivation film.

17. The semiconductor device according to claim 10, further comprising:
    an adhesion layer between said seed metal layer and an electrode pad portion, said electrode pad portion and seed metal layer touching said adhesion layer.

18. The semiconductor device according to claim 17, wherein said adhesion layer is titanium.

19. The semiconductor device according to claim 17, wherein said electrode pad portion is aluminum.

20. The semiconductor device according to claim 17, wherein said electrode pad portion is between said adhesion layer and a semiconductor substrate.

* * * * *